(12) United States Patent
Lin et al.

(10) Patent No.: US 10,534,393 B2
(45) Date of Patent: Jan. 14, 2020

(54) TWO-TRANSISTOR BANDGAP REFERENCE CIRCUIT AND FINFET DEVICE SUITED FOR SAME

(71) Applicant: Taiwan Semiconductor Manufacturing Co., Ltd., Hsin-Chu (TW)

(72) Inventors: Yvonne Lin, Saratoga, CA (US); Da-Wen Lin, Hsinchu (TW); Peter Huang, Pleasanton, CA (US); Paul Rousseau, Sunnyvale, CA (US); Sheng-Jier Yang, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/106,476

(22) Filed: Aug. 21, 2018

(65) Prior Publication Data

US 2018/0356852 A1 Dec. 13, 2018

Related U.S. Application Data

(62) Division of application No. 15/007,684, filed on Jan. 27, 2016, now Pat. No. 10,466,731.

(51) Int. Cl.
*H01L 29/78* (2006.01)
*H01L 21/8234* (2006.01)
(Continued)

(52) U.S. Cl.
CPC ................ *G05F 3/16* (2013.01); *G05F 1/465* (2013.01); *G05F 1/468* (2013.01); *G05F 1/595* (2013.01);
(Continued)

(58) Field of Classification Search
CPC ......... H01L 29/66787; H01L 29/66795; H01L 29/785; H01L 29/7851; H01L 29/7831; H01L 27/0886
See application file for complete search history.

(56) References Cited

U.S. PATENT DOCUMENTS 5,422,591 A 6/1995 Rastegar et al.
6,160,393 A 12/2000 Ahn et al.
(Continued)

FOREIGN PATENT DOCUMENTS

CN 101236995 A 8/2008
CN 102386230 A 3/2012
TW 201125043 A 7/2011

OTHER PUBLICATIONS

Notice of Allowance dated Jun. 27, 2019 in connection with U.S. Appl. No. 15/007,684.
(Continued)

*Primary Examiner* — Jesse Y Miyoshi
(74) *Attorney, Agent, or Firm* — Eschweiler & Potashnik, LLC

(57) ABSTRACT

Some embodiments relate to a method. A semiconductor substrate is provided and has a base region and a crown structure extending upwardly from the base region. A plurality of fins are formed to extend upwardly from an upper surface of the crown structure. A gate dielectric material is formed over upper surfaces and sidewalls of the plurality of the fins. A conductive electrode material is formed over upper surfaces and sidewalls of the gate dielectric material. An etch is performed to etch back the conductive electrode material so upper surfaces of etched back conductive electrodes reside below the upper surfaces of the plurality of fins.

8 Claims, 7 Drawing Sheets

(51) Int. Cl.
*H01L 27/088* (2006.01)
*H01L 29/06* (2006.01)
*H01L 29/66* (2006.01)
*G05F 3/16* (2006.01)
*G05F 1/46* (2006.01)
*G05F 1/595* (2006.01)
*G05F 3/24* (2006.01)

(52) U.S. Cl.
CPC ............... *H01L 21/823431* (2013.01); *H01L 21/823475* (2013.01); *H01L 27/0886* (2013.01); *H01L 29/0649* (2013.01); *H01L 29/0657* (2013.01); *H01L 29/66795* (2013.01); *H01L 29/785* (2013.01); *H01L 29/7831* (2013.01); *G05F 3/247* (2013.01)

(56) References Cited

U.S. PATENT DOCUMENTS

| | | | |
|---|---|---|---|
| 6,211,659 | B1 | 4/2001 | Singh |
| 6,458,662 | B1 | 10/2002 | Yu |
| 6,642,090 | B1 | 11/2003 | Fried et al. |
| 6,700,363 | B2 | 3/2004 | Tachimori |
| 8,564,275 | B2 | 10/2013 | Seok et al. |
| 8,896,055 | B2 | 11/2014 | Yeh et al. |
| 2005/0019993 | A1* | 1/2005 | Lee .................. H01L 29/42384 438/157 |
| 2014/0346574 | A1* | 11/2014 | Cai .................. H01L 29/66795 257/288 |
| 2015/0234401 | A1 | 8/2015 | Porras et al. |
| 2015/0249087 | A1* | 9/2015 | Cantoro ............. H01L 27/0924 257/369 |
| 2017/0040889 | A1 | 2/2017 | Chen et al. |
| 2017/0141226 | A1* | 5/2017 | Jacob .................. H01L 29/7848 |

OTHER PUBLICATIONS

Non-Final Office Action dated Oct. 19, 2018 in connection with related U.S. Appl. No. 15/007,684.

Maryam, et al. "A Sub-1V 32nA Process, Voltage and Temperature Invariant Voltage Reference Circuit," 2013 26th International Conference on VLSI Design and the 12th International Conference on Embedded Systems. Jan. 5-10, 2013.

Drennan, et al. "Implications of Proximity Effects for Analog Design." IEEE 2006 Custom Integrated Circuits Conference (CICC). Sep. 10-13, 2006.

Sansen, et al. "Analog design procedures for channel lengths down to 20 nm." Electronics, Circuits, and Systems (ICECS), 2013 IEEE 20th International Conference on, p. 337-340. Dec. 2013.

Sansen, et al. "Analog CMOS from 5 Micrometer to 5 Nanometer." ISSCC 2015 / Session 1 / Plenary / 1.3. Feb. 2015.

Seok, et al. "A Portable 2-Transistor Picowatt Temperature Compensated Voltage Reference Operating at 0.5 V." IEEE Journal of Solid-State Circuits, vol. 47, No. 10, Oct. 2012.

Non-Final Office Action dated Jan. 26, 2017 for U.S. Appl. No. 15/007,684.

Final Office Action dated Aug. 4, 2017 for U.S. Appl. No. 15/007,684.

Final Office Action dated Apr. 24, 2019 in connection with U.S. Appl. No. 15/007,684.

* cited by examiner

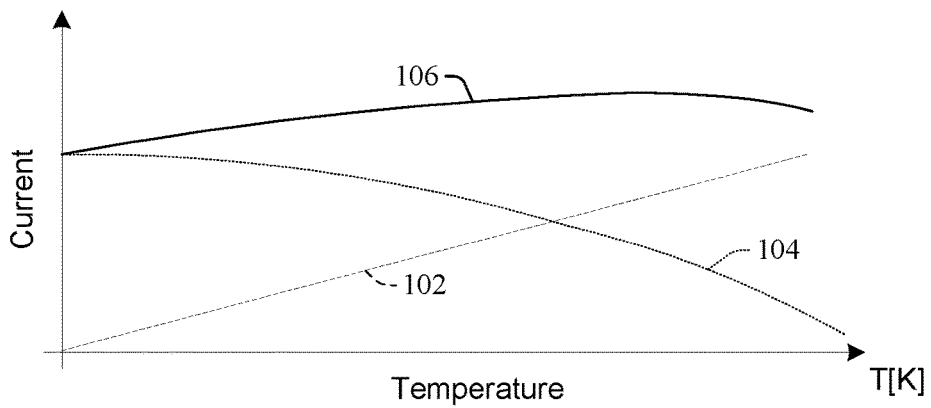
Fig. 1
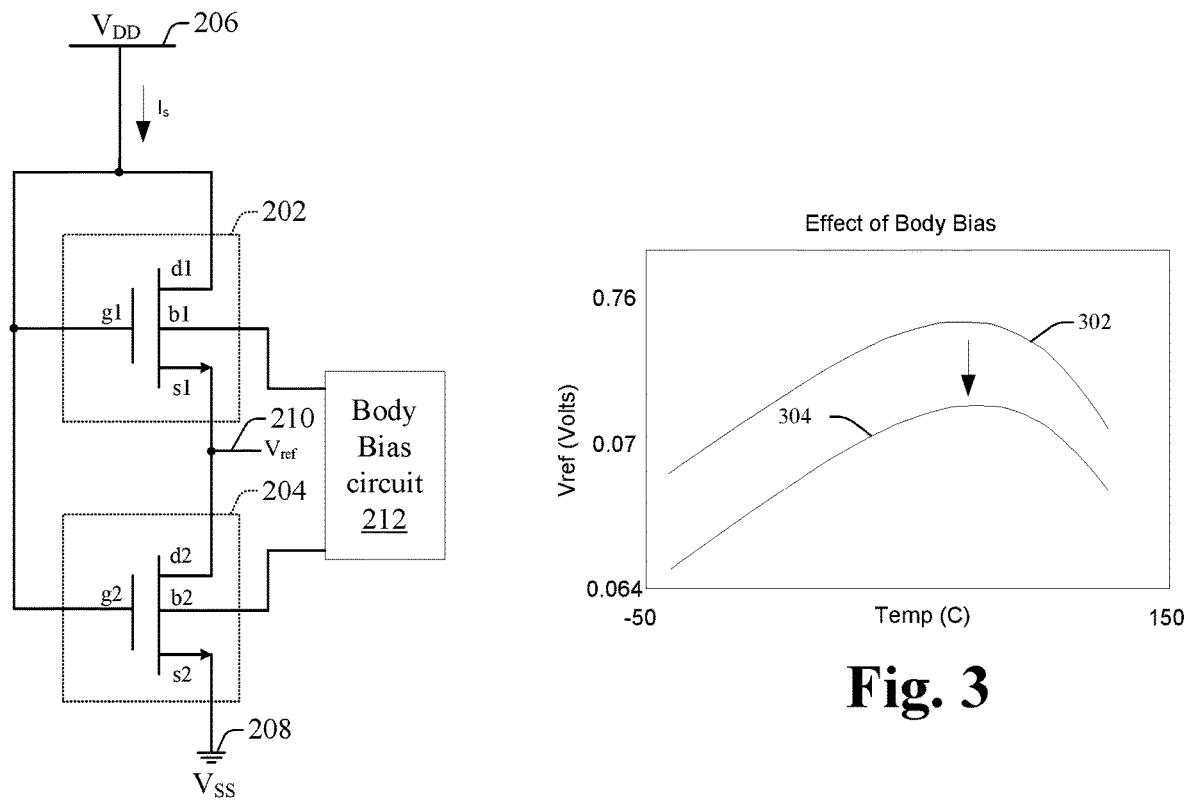
Fig. 2
Fig. 3

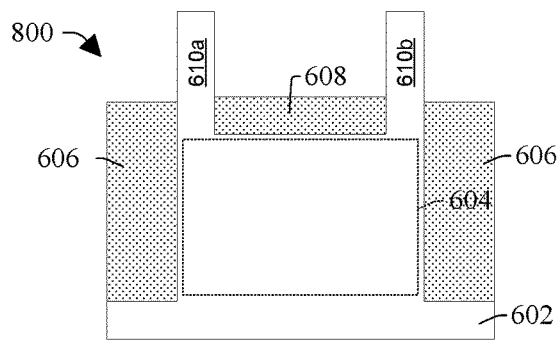
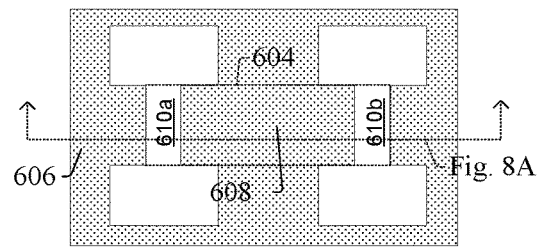
Fig. 8A　　　　　Fig. 8B
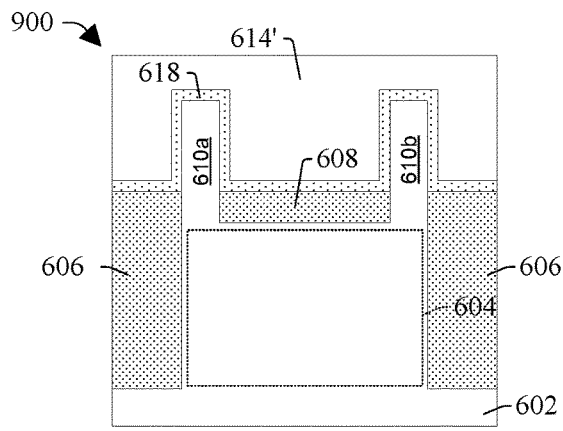
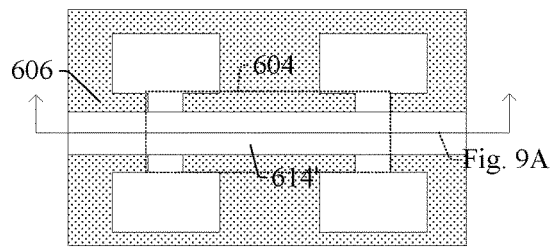
Fig. 9A　　　　　Fig. 9B
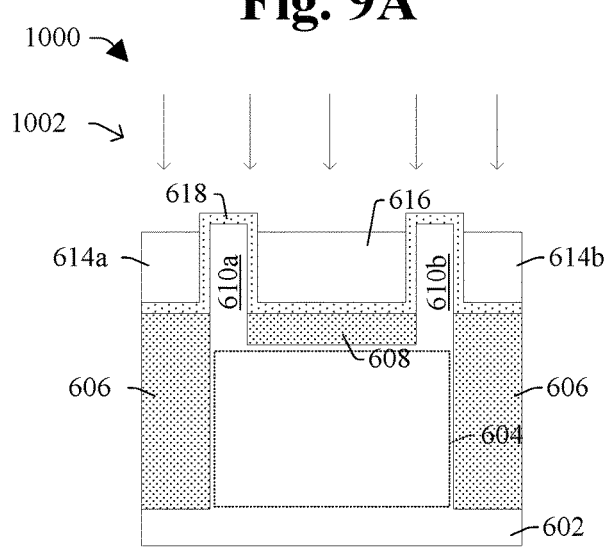
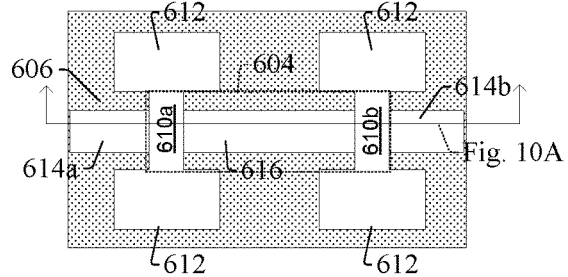
Fig. 10A　　　　Fig. 10B

TWO-TRANSISTOR BANDGAP REFERENCE CIRCUIT AND FINFET DEVICE SUITED FOR SAME

REFERENCE TO RELATED APPLICATION

This Application is a Divisional of U.S. application Ser. No. 15/007,684 filed on Jan. 27, 2016, the contents of which are hereby incorporated by reference in their entirety.

BACKGROUND

A well-regulated power supply is a component of integrated circuits (ICs). If power is not well regulated, variations in voltage, current, and the like can cause semiconductor devices of an IC to operate outside of their desired operating ranges. To provide a stable voltage source, bandgap reference (BGR) circuits are widely used in ICs. A BGR circuit is a voltage reference circuit that produces a substantially fixed (constant) voltage regardless of power supply variations, temperature changes, and changes in circuit loading from on-chip or off-chip devices. For example, while outputs of other voltage supplies, such as a battery, may change significantly as a function of temperature, BGR circuits are substantially constant over temperature due to their design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 illustrates chart depicting proportional to absolute temperature (PTAT) and complementary to absolute temperature (CTAT) curves for a bandgap reference (BGR) circuit.

FIG. 2 illustrates a bandgap reference circuit that includes a body bias circuit in accordance with some embodiments.

FIG. 3 illustrates a chart depicting the effect of body bias on a reference voltage signal provided by a bandgap reference circuit in accordance with some embodiments.

FIGS. 8A-8B through 13A-13B illustrate some embodiments of cross-sectional views and top views at various stages of manufacture of a method of forming FinFET devices.

DETAILED DESCRIPTION

Figure 4A:
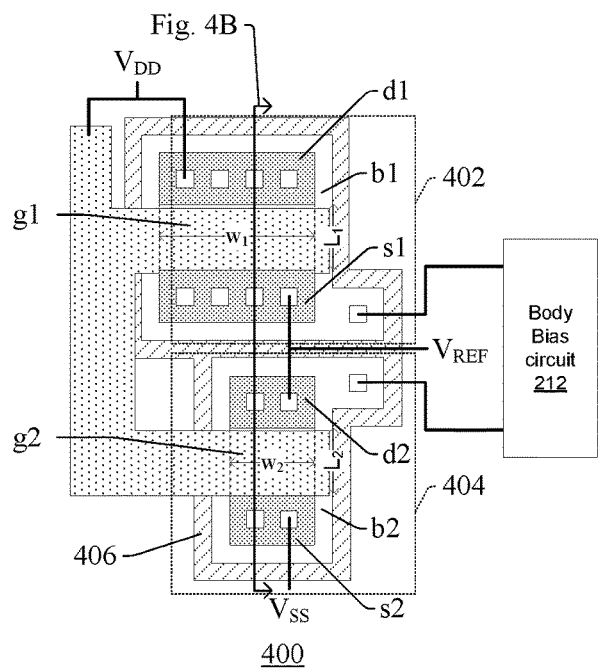
FIG. 4A illustrates a layout view of a bandgap reference circuit in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Bandgap reference (BGR) circuits provide a substantially constant reference voltage over a wide range of temperature. To achieve such a substantially constant reference voltage, BGR circuits sum two current components, for example as shown in FIG. 1. The first of these current components (represented by first curve 102) is referred to as a proportional to absolute temperature (PTAT) current and tends to increase with an increase in temperature. The second of these current components (represented by second curve 104) is referred to as a complementary to absolute temperature (CTAT), and tends to decrease with an increase in temperature. Thus, the PTAT and CTAT curves 102, 104 offset one another such that their sum (represented by third curve 106) is substantially constant over temperature. This summation of currents represented by third curve 106 can be used to establish a voltage reference, $V_{ref}$, which is stable over temperature and which can be used to power semiconductor devices on an IC. Because $V_{ref}$ is stable, it helps the semiconductor devices to operate within their desired operating ranges, and helps the final electronic product to work in a reliable manner, even when encountering temperature extremes.

FIG. 2 illustrates some embodiments of a two transistor (2T) band gap reference (BGR) circuit 200 that makes use of such PTAT and CTAT components. The 2T BGR circuit 200 includes a first transistor 202 and a second transistor 204, which are arranged in series between a first DC supply terminal 206, such as a $V_{DD}$ node of 0.4 V for example, and a second DC supply terminal 208, such as a $V_{SS}$ node of 0 V for example.

The first transistor 202 includes a first source (s1), a first drain (d1), and a first body region (b1), which separates the first source s1 from the first drain d1. The first drain (d1) and a first gate (g1) of the first transistor 202 are coupled to the first DC supply terminal 206. The second transistor 204 includes a second source (s2), a second drain (d2), and a second body region (b2), which separates the second source s2 from the second drain d2. A second gate (g2) is coupled to the first DC supply terminal 206, and the second source (s2) is coupled to the second DC supply terminal 208. The second drain d2 is coupled to the first source s1 and corresponds to an output terminal 210 of the 2T BGR circuit 200. A reference voltage, $V_{ref}$, which is substantially constant over changes in temperature and over changes in $V_{DD}$ and $V_{SS}$, is provided at the output terminal 210.

In an effort to reduce the voltage level of $V_{ref}$ output by the 2T BGR circuit 200, the 2T BGR circuit 200 includes body bias circuit 212. The body bias circuit 212 is configured to apply a body bias to at least one of the first and second transistors 202, 204 to alter the threshold voltages of the first and second transistors and correspondingly "tune" $V_{ref}$ in a suitable manner. In some embodiments, a body bias in the form of a reverse bias is applied to the first transistor 202 in a constant manner during operation of the 2T BGR circuit 200. In other embodiments, forward or reverse biases of the same or different magnitudes can be applied to the first and/or second body regions b1, b2 during operation.

More particularly, in some embodiments, the reference voltage, $V_{ref}$, output by BGR circuit 200 can be approximated by equation (1), as follows:

$$Vref = (V_{th},204 - V_{th},202) + \eta V_T \ln\left(\frac{t_{ox,202}(W_{204}/L_{204})}{t_{ox,204}(W_{204}/L_{202})}\right) \quad (1)$$

where $V_{th,202}$ and $V_{th,204}$ are threshold voltages for the first and second transistors 202, 204, respectively; $\eta$ is a subthreshold slope constant having an approximate value of 1.45; and $V_T$ is a thermal voltage of the 2T BGR circuit 200. The thermal voltage $V_T$ depends on absolute temperature T as $V_T=kT/q$, where q is the magnitude of electrical charge for an electron (q=1.602176565(35)×10$^{-19}$ C) and k is the Boltzmann's constant (k=1.3806488(13)×10$^{-23}$ J/K). Still referring to equation (1), $t_{ox202}$, $t_{ox204}$ are gate dielectric thicknesses of first and second transistors 202, 204, respectively; and $W_{202}/L_{202}$ and $W_{204}/L_{204}$ are width-to-length ratios of the first and second transistors 202, 204. The left-hand term in the expression above (i.e., ($V_{th, 204}$-$V_{th,202}$)) exhibits CTAT behavior, while the right-hand term (i.e., $$\eta V_T \ln\left(\frac{t_{ox,202}(W_{204}/L_{204})}{t_{ox,204}(W_{202}/L_{202})}\right)$$

exhibits PTAT behavior.

In some embodiments, $W_{202}/L_{202}$ and $W_{204}/L_{204}$ for the first and second transistors 202, 204, respectively, can be set to different ratios in an effort to make $V_{ref}$ substantially constant over changes in temperature. In one example, $V_{DD}$ is approximately 0.4V; $V_{TH,202}$ is approximately 0.28 V, $W_{202}/L_{202}$ is approximately 4, $V_{th,204}$ is approximately 0.32 V, $W_{204}/L_{204}$ is approximately 2, $I_s$ is approximately 1 µA; and the resultant $V_{ref}$ can lie within 0.06 V and 0.08V over a temperature range of −40° C. to 140° C.

The present disclosure finds that setting $W_{202}/L_{202}$ for the first transistor 202 to a different ratio than $W_{204}/L_{204}$ for the second transistor 204 increases the right-hand term in equation (1), thereby providing a large PTAT current component. If a similarly large left-hand term (CTAT current component) is used to offset or cancel this large PTAT, the result is a sum of two large current components, which tends to increase the overall $V_{ref}$. Due to the fact that $V_{ref}$ can be used as a voltage supply for devices on the IC (and because power consumption is proportional to $P=I_sV_{ref}$), increasing $V_{ref}$ tends to undesirably increase the power consumption of the IC. Therefore, to reduce the overall $V_{ref}$ output by the 2T BGR circuit 200, a body bias can be applied to the first transistor 202 to increase $V_{th,202}$ (thereby making the left-hand term of equation (1) more negative and reducing the overall $V_{ref}$). For example, during operation, the body bias circuit 212 can apply a voltage of −1 V to the first body region (b1) while applying a voltage of 0 V to the second body region b2 (or floating the second body region b2). This reverse bias condition for the first body region b1 tends to increase the threshold voltage for the first transistor ($V_{th, 202}$), thereby making the left-hand portion of equation (1) more negative and reducing $V_{ref}$ output by the BGR circuit 200. By reducing $V_{ref}$, the present body biasing techniques enable reduced power supply voltages for electronic devices, including for example, advanced and next generation mobile electronic devices. This reduced power supply voltage can provide these devices with lower overall power consumption, and correspondingly longer operating time between battery charges.

Although the illustrated 2T BGR circuit in FIG. 2 has been depicted and described with regards to first and second transistors 202, 204 in the form of NMOS transistors, it will be appreciated that other embodiments the first and second transistors could take other forms. For example, the first and second transistors 202, 204 could also be PMOS transistors, provided the gates and drains of the PMOS transistors are coupled to VSS and the sources of the PMOS transistors are coupled to VDD. Further although MOS-type devices are illustrated and described, other types of transistors, such as bipolar junction transistors (BJTs), junction field effect transistors (JFETs), and FinFETs, among others, could also be used.

FIG. 3 is a chart illustrating the effect of different body biases on the 2T BGR circuit 200 of FIG. 2 in accordance with some embodiments. Two curves, each illustrating a $V_{ref}$ output by the 2T BGR circuit 200 of FIG. 2 as a function of temperature, are illustrated. The first curve 302 illustrates a case where the ratio between the first $W_{202}/L_{202}$ and the second $W_{204}/L_{204}$ is 1:6, and a body bias of approximately 0 V is applied to the first body region of the first transistor 202. As can be seen from the first curve 302, under this bias condition, the 2T BGR circuit 200 produces a $V_{ref}$ of approximately 0.07 V. The second curves 304 illustrates a case where the ratio between the first $W_{202}/L_{202}$ and the second $W_{204}/L_{204}$ is still 1:6, but now a reverse bias of approximately (−1 V) is applied to the body region of the first transistor 202. Because of this change in body bias, the second curve 304 exhibits a reference voltage, $V_{ref}$, having a drop of approximately 5 mV or 6 mV (a reduction in nearly 10%) compared to the first curve 302. Thus, the use of a body bias in the context of this 2T BGR circuit 200 represents a technique for reducing the output reference voltage, $V_{ref}$, which can be used to power on-chip semiconductor devices, for example. For another example, the use of a body bias is also applicable for future technology nodes, such as devices with feature sizes of 7 nm or below, where power supplies continue to drop. This reduction in reference voltage, $V_{ref}$, can reduce the overall power consumption of the chip and provide end users with mobile electronic devices that have longer battery life between battery charges.

Figure 4B:
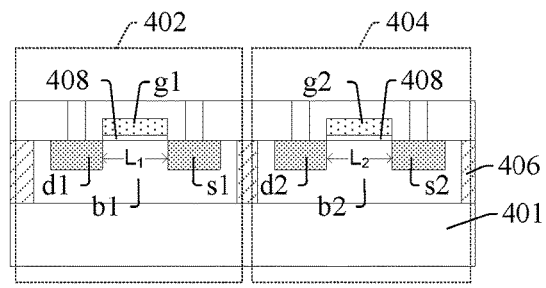
FIG. 4B provides a cross-section view of FIG. 4A's bandgap reference circuit in accordance with some embodiments.

FIG. 4A illustrates an example layout (top) view of a 2T BGR circuit 400 in accordance with some embodiments, and FIG. 4B shows a cross-sectional view as indicated by the sectional line in FIG. 4A. Referring to FIGS. 4A-4B, the 2T BGR circuit 400 is consistent with FIG. 2's schematic, and thus includes a first transistor 402 (consistent with first transistor 202 in FIG. 2) and a second transistor 404 (consistent with second transistor 204 in FIG. 2) which are disposed over a semiconductor substrate 401. The first transistor 402 includes a first source s1 and first drain d1, which have a first doping type (e.g., n-type) and are spaced apart from one another by a first body region b1 having a second doping type (e.g., p-type). The second transistor 404 includes a second source s2 and second drain d2, which have the first doping type (e.g., n-type) and are spaced apart from one another by a second body region b2 having the second doping type (e.g., p-type). A first gate g1 overlies the first body region b1, and a second gate g2 overlies the second body region b2. The first and second gates g1, g2 can be metal gates or doped polysilicon gates, and are separated from the first and second body regions b1, b2 by a gate dielectric 408, such as a high-κ dielectric or $SiO_2$ dielectric. If present, the high-κ dielectric has a dielectric constant greater than that of the silicon dioxide ($SiO_2$ has a dielectric constant of around 3.9). In some embodiments, the high-κ dielectric may comprise a composite including hafnium, such as hafnium oxide ($HfO_x$), hafnium silicon oxynitride (HfSiON) and so on. The high-κ dielectric layer 106 can also comprise other suitable materials such as zirconium oxide ($ZrO_x$), aluminum oxide ($AlO_x$), nickel oxide ($NiO_x$), tantalum oxide ($TaO_x$), or titanium oxide ($TiO_x$), for example. A shallow-trench isolation (STI) region 406 laterally surrounds the first and second transistors, and isolates the first and second transistors from one another. The STI region 406 may be made of dielectric material.

As shown in FIG. 4A, the first transistor 402 has a first length L1, which can be measured along a line between the nearest edges of the first source s1 and first drain d1. The first transistor 402 also has a first width, W1, which can be measured perpendicular to the first length. The second transistor has a second length L2, and a second width, W2. A first width-to-length ratio W1/L1 of the first transistor 402 is often different from a second length-to-width ratio W2/L2 of the second transistor 404. For example, in some embodiments, W1/L1 can be larger than W2/L2 by a factor ranging from just greater than one to less than ten, with W1/L1 being approximately 6 times larger than W2/L2 in some embodiments. Changing a ratio between W1/L1 and W2/L2 for different implementations can correspondingly change $V_{Ref}$ output by the BGR circuit 400. In other embodiments, W1/L1 can be equal to W2/L2 or W1/L1 can be less than W2/L2. The body bias circuit 212 can apply the same or different body biases to the first and second body regions b1, b2 to further tune $V_{ref}$ output by the BGR circuit 400.

Figure 5:
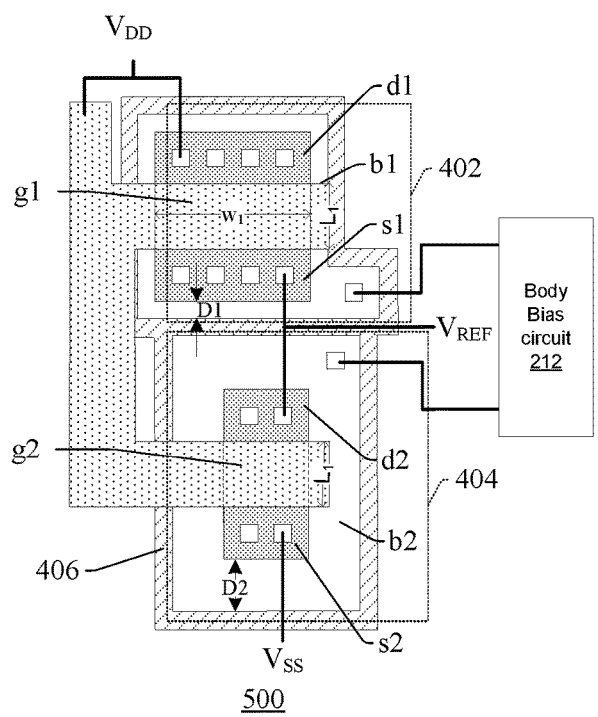
FIG. 5 illustrates a layout view of a bandgap reference circuit including transistors with different STI-to-source/drain spacings in accordance with some embodiments.

FIG. 5 shows another example layout view of a 2T BGR circuit 500 in accordance with some embodiments. Again, this 2T BGR circuit 500 is consistent with some examples of FIG. 2's circuit 200, in that first transistor 402 can correspond to first transistor 202 of FIG. 2 and second transistor 404 can correspond to second transistor 204 of FIG. 2. This example layout view provides an example of a layout design effect (LDE) that can be used to alter the threshold voltages of the first and second transistors 402, 404 in the BGR circuit 500. Compared to FIG. 4A's embodiment in which the first and second transistors had the same spacing between STI region 406 and source/drain regions (e.g., s1 and s2), the first and second transistors in FIG. 5 have different spacings between their STI region 406 and source/drain regions. For example, the first transistor 402 has a first spacing, d1, between an edge of the first source region s1 and a neighboring edge of the STI region 406, and the second transistor 404 has a second (e.g., greater) spacing, D2, between an edge of the second source region s2 and a neighboring edge of the STI region 406. By having different STI-source/drain spacings for the first and second transistors 402, 404, the threshold voltages of the first and second transistors 402, 404 can be tuned to different values from one another. For example, if the first spacing, D1, for the first transistor 402 is greater than the second spacing, D2, for the second transistor 404, the voltage threshold of the first transistor 402 can be increased relative to that of the second transistor 404. For example, in some embodiments, the threshold voltage of the first transistor 402 can be greater than the threshold voltage of the second transistor 404 by a predetermined amount excluding process variation. For another example, the first threshold voltage can be greater than the second voltage threshold by more than 10%, more than 30%, or more than 50% when excluding variations in doping due to process variation; and can be greater than the second voltage threshold by more than 30%, more than 40% or even by more than 50% when including variations in doping due to process variation. Thus, in accordance with equation (1) above, the threshold voltage for the first transistor (202/402) can be increased, which tends to reduce the overall Vref of the BGR circuit 500. The body bias circuit 212 can apply suitable body biases to the first and/or second body regions b1, b2 to increase the threshold voltage of the first transistor 402, which can further decrease Vref according to equation (1) in accordance with some embodiments.

Figure 6A:
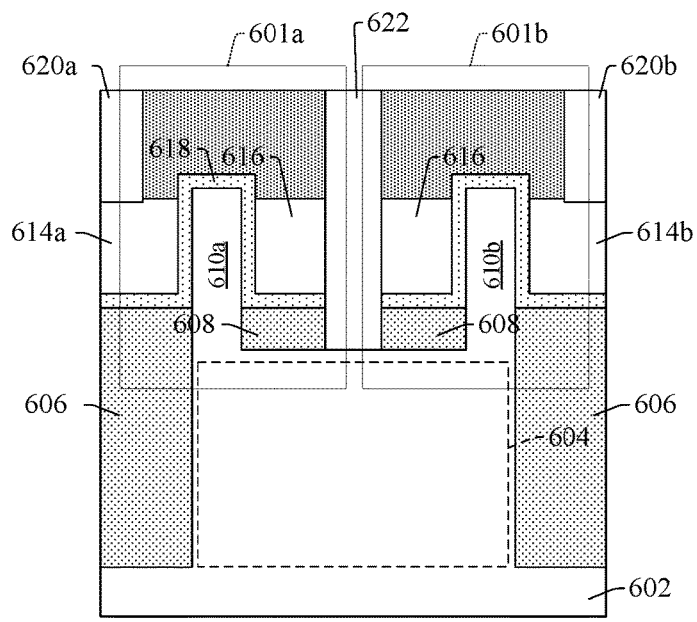
FIGS. 6A and 6B illustrate a cross-sectional view and top view of a FinFET device in accordance with some embodiments.
Figure 6C:
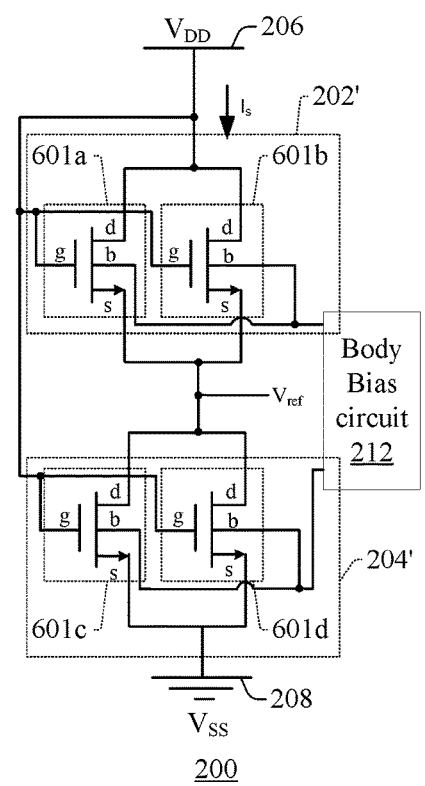
FIG. 6C illustrates a bandgap reference circuit that includes a body bias circuit implemented with FinFET devices, such as those of FIGS. 6A and 6B, in accordance with some embodiments.
Figure 6B:
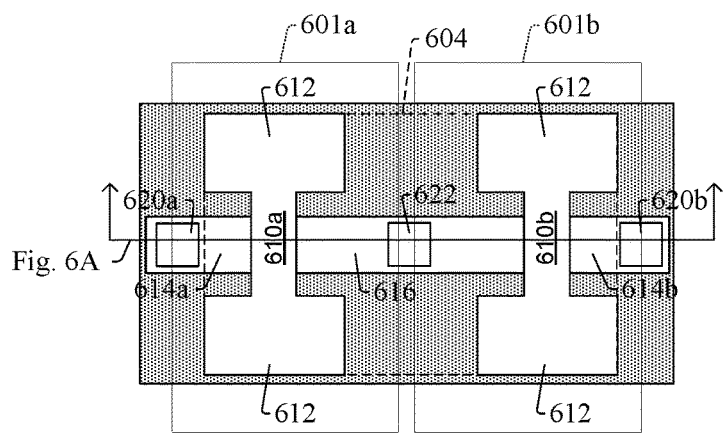

In some embodiments, the first and/or second transistors of a 2T BGR circuit (e.g., 2T BGR circuit 200) can be implemented as finFET devices, such as shown in FIGS. 6A-6B. The illustrated first and second finFET devices 601a, 601b are disposed on a semiconductor substrate. The semiconductor substrate comprises a crown structure 604 made up of a plateau of semiconductor material extending upwardly from a planar, base region of the semiconductor substrate 602. In some embodiments, the first and second finFET devices 601a, 601b have a common body bias contact 622 and can be arranged in parallel with one another, such as shown in FIG. 6C, so the second transistor 202' which is made of the first and second transistors 601a, 601b collectively correspond to an example of first transistor 202 of FIG. 2. As shown in FIG. 6C, the second transistor 204' can also be made of two finFET devices 601c, 601d, which are arranged in parallel with one another and which receive a different body bias from the first and second finFET devices 601a, 601b.

First and second fins 610a, 610b extend upwardly from an upper surface of the crown structure 604. In some embodiments, the first and second fins 610a, 610b comprise one or more semiconductor materials. The fins 610a, 610b are in direct contact with the crown structure 604, and the fins 6101, 610b can act as body regions of the finFET devices 601a, 601b.

Peripheral isolation regions 606 cover upper surface of the base region of the substrate 602, while internal isolation regions 608 cover upper surface of the crown structure 604. The peripheral isolation regions 606 and internal isolation regions 608 have co-planar upper surfaces, and extend upward along lower sidewalls of the fins 610a, 610b. In extending downward to the base region of the substrate 602, the peripheral isolation regions 606 generally have a greater depth than the internal isolation regions 608. The peripheral isolation regions 606 and internal isolation regions 608 are typically made of a dielectric material, such as $SiO_2$ or a low-κ dielectric material.

As shown in FIG. 6B, the fins 610a, 610b each extend laterally between corresponding source and drain regions 612.

Referring to FIGS. 6A-6B concurrently, peripheral gate electrodes 614a, 614b, such as metal gates or doped-polysilicon gates, are arranged along outermost sidewalls of the fins 610a, 610b. However, the peripheral gate electrodes 614a, 614b do not extend over an upper surface of the fins 610a, 610b, such that the peripheral gate electrodes 614 are electrically isolated from a central electrode 616 disposed between the fins 610a, 610b. A gate dielectric 618 separates the peripheral gate electrodes 614a, 614b from the fins 610a, 610b.

Conductive plugs 620a, 620b extend downward to make ohmic contact with the peripheral gate electrodes 614a, 614b, respectively. A body contact 622 extends downward between fins 610a, 610b to make ohmic contact with a central region of the crown structure 604 between the fins 610a, 610b. Portions of the fins 610a, 610b (the portions being laterally constrained in a first direction between the source/drain regions 612 and being laterally constrained in a second direction between inner sidewalls of the gate electrodes 614 and central electrode 616) have a doping type that is opposite that of the source/drain regions 612, thereby establishing body regions within the fins 610a, 610b. Thus, the body contact 622 and central region of the crown structure 604 are electrically coupled to the body regions of the fins 610a, 610b. The body contact 622 also can be shorted to the central electrode 616.

Thus, during device operation, a first voltage can be applied to the body contact 622 to provide a body bias to the fins 610a, 610b and to the central electrode 616; and second and third voltages, which can be the same or different from one another (and the same or different from the first voltage), can be applied to the first and second gate contacts 620a, 620b to selectively enable/disable conductive channels in the first and second fins 610a, 610b, respectively.

Figure 7A:
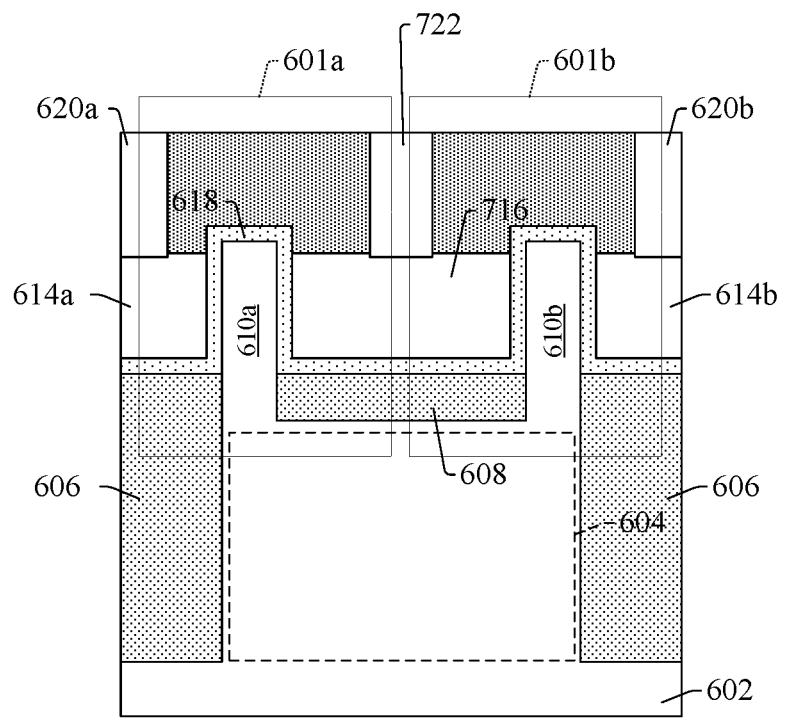
FIGS. 7A and 7B illustrate a cross-sectional view and top view of another FinFET device in accordance with some embodiments.
Figure 7B:
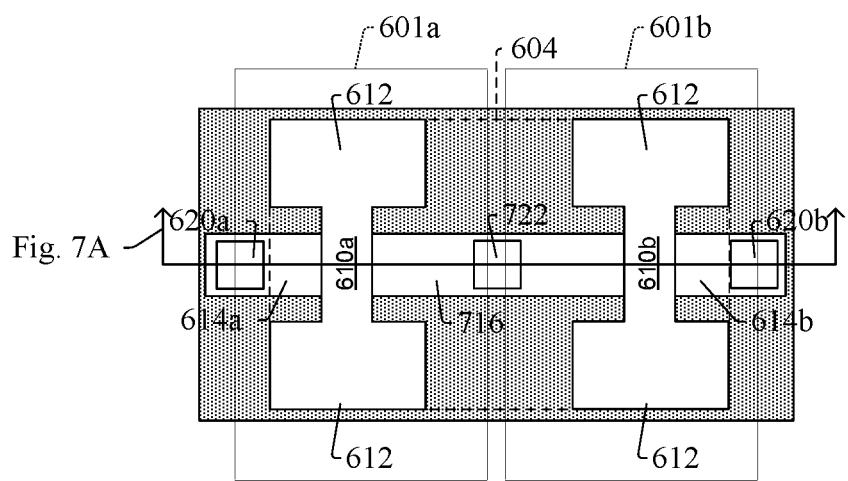

FIGS. 7A-7B show another embodiment where first and second finFET devices 601a, 601b are disposed on a semiconductor substrate. The semiconductor substrate comprises a crown structure 604 made up of a plateau of semiconductor material extending upwardly from a planar, base region of the semiconductor substrate 602. In contrast to FIG. 6A-6B, in FIG. 7A-7B the central gate electrode 716 is isolated from the crown structure 604 by central isolation region 608. Thus, in the embodiment of FIGS. 7A-7B, rather than the crown structure 604 and body region being biased through a body contact (see body contact 622 in FIG. 6A), the crown structure 604 in FIG. 7A is left floating without a bias applied thereto. Thus, in FIG. 7A, a gate contact 722 extends downward to central gate electrode 716, which acts as a gate electrode, but is still isolated from peripheral gate electrodes 614a, 614b. The same or different gate voltages can be applied to central gate electrode 716 and each of peripheral gate electrodes 614a, 614b, wherein the peripheral gate electrodes 614a, 614b can be biased independently of one another.

With reference to FIGS. 8A-8B through 13A-13B, cross-sectional views (FIG. 8A, 9A, 10A, . . . ) and corresponding top views (FIG. 8B, 9B, 10B, . . . ) are provided, and used to illustrate a method of forming FinFET devices according to some embodiments.

As shown in FIG. 8's cross-sectional view 800, a plurality of fins is formed on a substrate. The substrate includes a base region 602 and a crown structure 604 extending upwardly from the base region 602. In FIG. 8's embodiment, first and second fins 610a, 610b extend upwardly from the crown structure 604, but it will be appreciated that any number of fins can extend upwardly from the crown structure 604. The crown structure 604 causes the substrate to have peripheral isolation regions 606 that extend to a first depth and internal isolation regions 608, which are located above the crown structure 604 and which extend to a second depth less than the first depth. The peripheral isolation regions 606 and internal isolation regions 608 are typically made of a dielectric material, such as $SiO_2$ or a low-κ dielectric material.

In some embodiments, the semiconductor substrate can be a bulk silicon substrate or a semiconductor-on-insulator (SOI) substrate (e.g., silicon on insulator substrate) in the form of a disc-like wafer. The substrate can also be a binary semiconductor substrate (e.g., GaAs), a tertiary semiconductor substrate (e.g., AlGaAs), a higher order semiconductor substrate, or even a sapphire substrate, for example. The substrate can include doped regions formed in or on the substrate, epitaxial layers formed in or on the substrate, insulating layers formed in or on the substrate, photoresist layers formed in or on the substrate, and/or conducting layers formed in or on the substrate. In many instances, the semiconductor substrate when in the form of a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. After formation of the relevant layers is completed, the semiconductor substrate can optionally be bonded to other substrates to establish a 3D IC, and can be cut or scribed into individual dies or integrated circuits, which are packaged and sold, for example to be placed on a board with other ICs and/or discrete electronic components.

As shown in FIG. 9's cross-sectional view 900, a gate dielectric 618 is formed over sidewalls and upper surfaces of the fins 610a, 610b, and a conductive gate electrode material 614' is formed over the gate dielectric 618. In some embodiments, the gate dielectric 618 is a high-κ dielectric layer or an $SiO_2$ layer, and the conductive gate electrode material 614' is doped polysilicon or a metal, such as copper, aluminum, nickel, or tungsten.

As shown in FIG. 10's cross-sectional view 1000, the conductive gate electrode material 614' is subjected to an etch 1002 to reduce the height of top surfaces of the conductive gate electrode. Thus, after the etch 1002, top surfaces of the etched back conductive gate electrode are below top surfaces of the neighboring fins. The etch 1002 also separates a central electrode 616 from peripheral gate electrodes 614a, 614b. The etching back process can be a dry etching process, such as a plasma etch, or a wet etch. The etch 1002 is selective to the conductive gate electrode material 614' compared to an upper layer of the gate dielectric 618, such that the gate dielectric 618 is largely left in place while the conductive gate electrode material is removed.

Figure 11A:
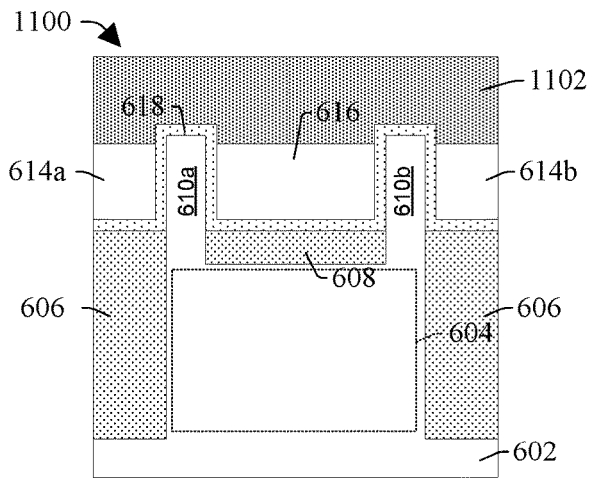
Figure 11B:
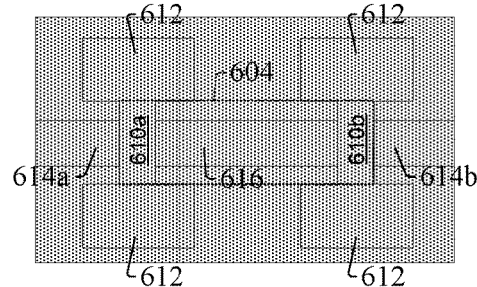

As shown in FIG. 11's cross-sectional view 1100, a dielectric layer 1102, such as a silicon nitride layer for example, is formed over the top surface of the peripheral gate electrodes 614a, 614b, over the central electrode 616, and over the top surfaces of the gate dielectric 618 over the fins 610a, 610b.

Figure 12A:
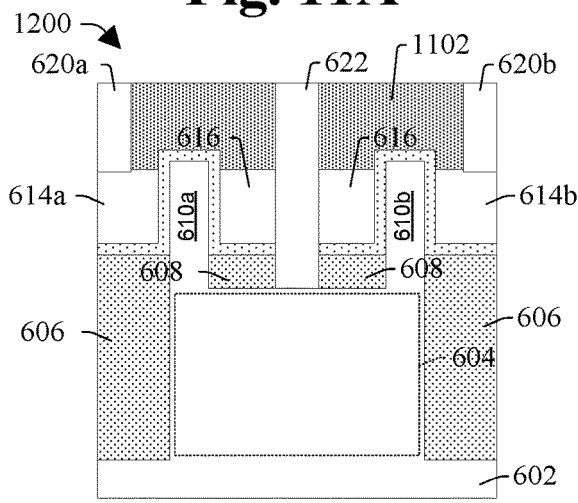
Figure 12B:
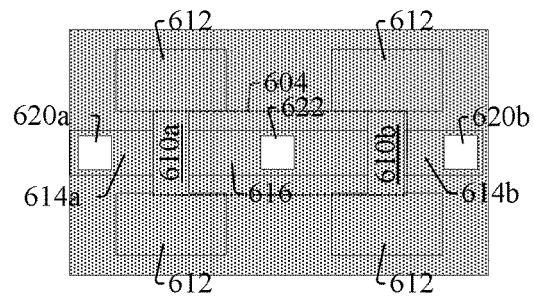
Figure 13A:
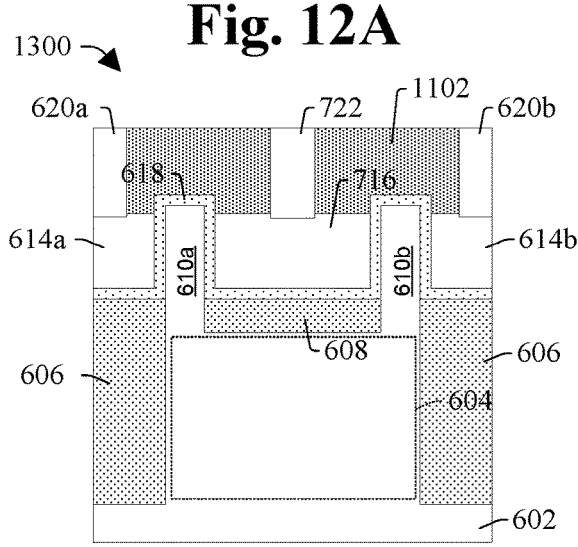
Figure 13B:
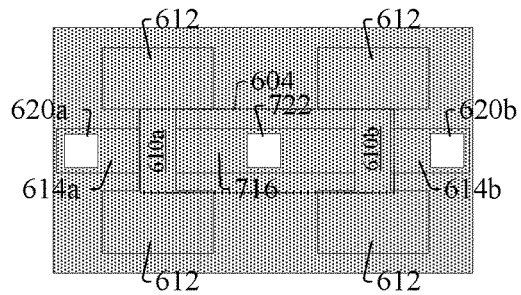

As shown in FIG. 12's cross-sectional view 1200, conductive contacts (620a, 620b, 622) are formed. Typically, a patterned mask, such as a patterned layer of photoresist, is formed over the structure to have openings corresponding to regions where the contacts are to be formed. Then one or more etches are carried out to form contact openings, and a conductive material such as a metal is formed in the openings to establish the contacts. First and second gate contacts 620a, 620b extend downward through the dielectric layer 1102 to peripheral gate electrodes 614a, 614b. A body contact 622 extends downward through the dielectric layer 1102 between the fins 610a, 610b to couple to the crown structure 604. In some embodiments, the first and second gate contacts openings are formed using a first mask and a first etching process, and the body contact opening is formed or completed by using a second mask and second etching process. After the conductive material is formed in the openings, a chemical mechanical planarization operation can be carried out, and higher levels of metal interconnect can be formed.

FIG. 13 illustrates some embodiments of a cross-sectional view 1300 corresponding to an alternative act used instead of FIG. 12, which can be used to form the structure of FIGS. 7A-7B.

As shown in FIG. 13's cross-sectional view 1300, gate contacts 620, 722 are formed. The gate contacts extend downward through the dielectric layer to peripheral gate electrodes 614a, 614b and to central gate electrode 716. In FIG. 13's embodiment, openings for the gate contacts are typically formed with a single mask and single etching procedure, followed by a formation of a conductive material in the openings to establish gate contacts 620, 722.

Figure 14:
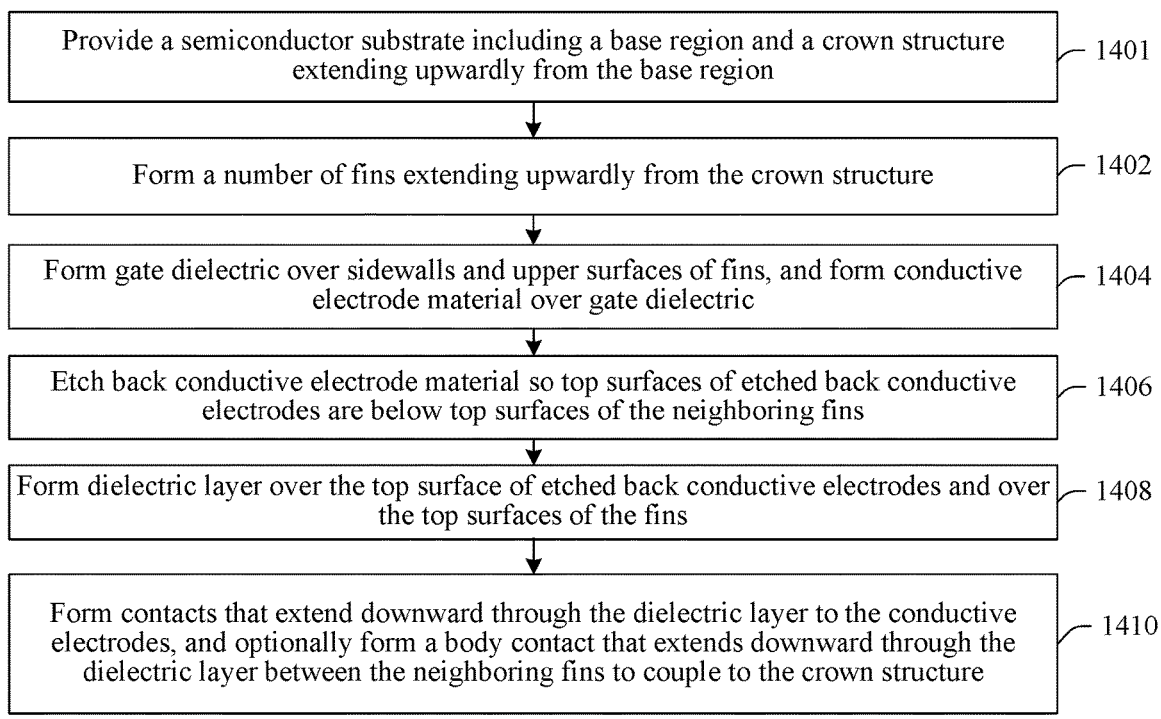
FIG. 14 illustrates a flow chart illustrating some methods of forming FinFET devices in accordance with some embodiments, and is an example of a method consistent with FIGS. 8A-8B through 13A-13B.

With reference to FIG. 14, a flowchart of some embodiments of a method 1400 for forming finFET devices. While the disclosed method 1400 and other methods illustrated and/or described herein may be illustrated and/or described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In 1401, a semiconductor substrate is provided. The substrate includes a base region and a crown region extending upwardly from the base region.

In 1402, neighboring fins are formed to extend upwardly from the crown structure. An example of act 1402 can be seen with regards to previously illustrated FIGS. 8A-8B.

In 1404, a gate dielectric is formed over sidewalls and upper surfaces of the fins, and a conductive gate electrode material is formed over the gate dielectric. An example of act 1404 can be seen with regards to previously illustrated FIGS. 9A-9B.

In 1406, the conductive gate electrode is etched back so top surfaces of the etched back conductive gate electrode are below top surfaces of the neighboring fins. An example of act 1406 can be seen with regards to previously illustrated FIGS. 10A-10B.

In 1408, a dielectric layer is formed over the top surface of the etched back conductive gate electrode and over the top surfaces of the fins. An example of act 1408 can be seen with regards to previously illustrated FIGS. 11A-11B.

In 1410, gate contacts are formed. The gate contacts extend downward through the dielectric layer 1102 to peripheral regions of the conductive gate electrode, and form a body contact that extends downward through the dielectric layer between the neighboring fins to couple to the crown structure. An example of act 1410 can be seen with regards to previously illustrated FIGS. 12A-12B.

Some embodiments of the present disclosure relate to a two transistor (2T) band gap reference (BGR) circuit. The 2T BGR circuit includes a DC supply terminal and first and second transistors. The first transistor includes a first source, a first drain, a first body region separating the first source from the first drain, and a first gate separated from the first body region by a first gate dielectric. The first drain and first gate are coupled to the DC supply terminal. The second transistor includes a second source, a second drain, a second body region separating the second source from the second drain, and a second gate separated from the second body region by a second gate dielectric. The second gate is coupled to the DC supply terminal, and the second drain is coupled to the first source and corresponds to an output terminal where a BGR voltage is provided. Body bias circuitry is configured to apply a body bias voltage to at least one of the first and second body regions.

In other embodiments, an integrated circuit (IC) is disposed on a semiconductor substrate that including a base region and a crown structure. The crown structure includes a plateau-like region of semiconductor material extending upwardly from the base region. A plurality of fins extend upwardly from an upper surface of the crown structure and are spaced apart from one another. A dielectric material is disposed over upper surfaces and along sidewalls of the plurality of fins. A plurality of conductive electrodes is disposed along sidewalls of the plurality of fins and are separated from the sidewalls of the fins by the dielectric material. The conductive electrodes have upper surfaces which are arranged below the upper surfaces of the plurality of fins and which do not extend directly over the upper surfaces of the plurality of fins.

Other embodiments relate to a method. In this method, a semiconductor substrate is provided. The substrate has a base region and a crown structure extending upwardly from the base region. A plurality of fins are formed to extend upwardly from an upper surface of the crown structure. A gate dielectric material is formed over upper surfaces and sidewalls of the plurality of the fins, and a conductive electrode material is formed over the gate dielectric material. An etch is performed to etch back the conductive electrode material so upper surfaces of etched back conductive electrodes reside below the upper surfaces of the plurality of fins.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with a second figure (e.g., and may even correspond to a "second dielectric layer" in the second figure), and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a semiconductor substrate having a base region and a crown structure extending upwardly from the base region;
   forming a plurality of fins extending upwardly from an upper surface of the crown structure;
   forming a gate dielectric material over upper surfaces and sidewalls of the plurality of the fins, and forming a conductive electrode material over upper surfaces and sidewalls of the gate dielectric material; and
   performing an etch to etch back the conductive electrode material to form etched back conductive electrodes, wherein upper surfaces of the etched back conductive electrodes correspond to a first height, and where the first height is less than a second height corresponding to the upper surfaces of the plurality of fins, wherein the first height and second height are each measured from the upper surface of the crown structure;
   wherein the etch forms first and second peripheral gate electrodes arranged on outermost sidewalls of neighboring fins, and concurrently forms a central electrode arranged between inner sidewalls of the neighboring fins, the first and second peripheral gate electrodes and the central electrode being separate conductive bodies that are spaced apart from one another by the neighboring fins; and
   forming a dielectric layer over the upper surfaces of the etched back conductive electrodes and over the upper surfaces of the neighboring fins; and
   forming a body contact that extends downward through the dielectric layer between the neighboring fins to couple to the crown structure.

2. The method of claim 1, wherein the etch is selective between the conductive electrode material and the gate dielectric material so the upper surfaces of the etched back conductive electrodes remain along sidewalls of the plurality of fins without extending over the upper surfaces of the fins, and wherein the etched back conductive electrodes reside below upper surfaces of the gate dielectric material which is left in place over the upper surfaces of the plurality of fins.

3. The method of claim 1, wherein the plurality of fins comprises a first fin corresponding to a first transistor and a second fin corresponding to a second transistor.

4. The method of claim 3, wherein the first transistor has a first threshold voltage and the second transistor has a second threshold voltage that differs from the first threshold voltage.

5. The method of claim 4, wherein the first threshold voltage is less than the second threshold voltage.

6. A method, comprising:
   providing a semiconductor substrate including a base region and a crown structure, the crown structure having outer sidewalls that extend upwardly from an upper surface of the base region such that an upper surface of the crown structure resides at a height above the upper surface of the base region;
   forming a first fin and a second fin extending upwardly from the upper surface of the crown structure, wherein a peripheral isolation region is disposed on the upper surface of the base region and surrounds the crown structure and the first and second fins, and wherein an internal isolation region is disposed on the upper surface of the crown structure and is spaced between the first and second fins;
   forming a gate dielectric material over an upper surface of the peripheral isolation region, over an upper surface of the internal isolation region, and along upper sidewalls and upper surfaces of the first and second fins;
   forming a conductive electrode material over upper surfaces of the gate dielectric material;
   performing an etch to etch back the conductive electrode material to form etched back conductive electrodes, wherein upper surfaces of the etched back conductive electrodes correspond to a first height, and where the first height is less than a second height corresponding to the upper surfaces of the gate dielectric material, wherein the first height and second height are each measured from the upper surface of the crown structure;
   forming a dielectric layer over the upper surfaces of the etched back conductive electrodes and over the upper surfaces of gate dielectric material; and
   forming a contact that extends downward through the dielectric layer between the first and second fins to couple to the crown structure and to couple to the etched back conductive electrodes.

7. A method of forming a two transistor band gap reference (BGR) circuit, the method comprising:
   forming a first fin and a second fin over a semiconductor substrate, the first fin including a first body region that separates a first source region and a first drain region, and the second fin including a second body region that separates a second source region and a second drain region;
   forming a gate dielectric layer over the first fin and over the second fin;
   forming a conductive gate layer over the gate dielectric layer;
   etching back the conductive gate layer to form a first conductive gate electrode and a second conductive gate electrode so upper surfaces of the first and second conductive gate electrodes reside below an upper surface of the gate dielectric layer, the first conductive gate electrode being disposed on opposite sides of the first fin and separated from the first fin by the gate dielectric layer, and the second conductive gate electrode being disposed on opposite sides of the second fin and separated from the second fin by the gate dielectric layer;
   coupling a DC supply terminal to the first drain region and the first conductive gate electrode; and
   applying a body bias voltage to at least one of the first and second body regions;
   forming a dielectric layer over an upper surface of the first conductive gate electrode and over an upper surface of the second conductive gate electrode; and forming a body contact that extends downward through the dielectric layer between the first and second fins.

8. The method of claim 7, wherein applying the body bias voltage includes applying a negative body bias voltage to the first body region.

* * * * *